(12) United States Patent
Roman et al.

(10) Patent No.: US 6,852,555 B1
(45) Date of Patent: Feb. 8, 2005

(54) METHOD IN THE FABRICATION OF ORGANIC THIN-FILM SEMICONDUCTING DEVICES

(75) Inventors: Lucimara Stolz Roman, Linköping (SE); Olle Inganäs, Linköping (SE); Olle Hagel, Linköping (SE); Johan Carlsson, Linköping (SE); Göran Gustafsson, Linköping (SE); Magnus Berggren, Vreta Kloster (SE)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 09/720,329

(22) PCT Filed: Apr. 14, 2000

(86) PCT No.: PCT/NO00/00127

§ 371 (c)(1),
(2), (4) Date: Feb. 6, 2001

(87) PCT Pub. No.: WO00/65653

PCT Pub. Date: Nov. 2, 2000

(30) Foreign Application Priority Data

Apr. 22, 1999 (NO) .............................................. 991916

(51) Int. Cl.⁷ .............................................. H01L 21/00
(52) U.S. Cl. ......................................... 438/22; 257/40
(58) Field of Search ................................. 438/156, 160, 438/162, 479, 784, 22, 27, 29, 48, 82, 99; 257/40, 103, 291–293

(56) References Cited

U.S. PATENT DOCUMENTS

| | | | |
|---|---|---|---|
| 5,247,190 A | * | 9/1993 | Friend et al. .................. 257/40 |
| 5,705,888 A | | 1/1998 | Staring et al. |
| 5,726,457 A | | 3/1998 | Nakano et al. |
| 5,798,170 A | * | 8/1998 | Zhang et al. ............... 428/212 |
| 5,804,836 A | * | 9/1998 | Heeger et al. ................. 257/40 |
| 5,807,627 A | * | 9/1998 | Friend et al. ................ 428/212 |

(List continued on next page.)

FOREIGN PATENT DOCUMENTS

| | | |
|---|---|---|
| EP | 0716459 | 6/1996 |
| EP | 0786820 | 7/1997 |
| EP | 0852403 | 7/1998 |
| EP | 0901176 | 3/1999 |
| WO | WO 98 53510 | 11/1998 |

OTHER PUBLICATIONS

Brown, T.M. et al., Synthetic Metals, vols. 111–112 (2000) pp. 285–287.

(List continued on next page.)

*Primary Examiner*—David Nelms
*Assistant Examiner*—David Vu
(74) *Attorney, Agent, or Firm*—Birch, Stewart, Kolasch & Birch, LLP.

(57) ABSTRACT

In a method in the fabrication of an organic thin-film semiconducting device comprising an electrode arrangement with electrodes contacting a semiconducting organic material, an anode in the electrode arrangement is made as a two-layer structure, where the first layer is a conducting or semiconducting material or a combination thereof deposited on a substrate and a second layer is a conducting polymer with a work function higher than that of the material in the first layer. A third layer consisting of semiconducting organic material and forming the active material of the device is deposited on the top of the anode, and the cathode made of a fourth layer of a metal deposited on a third layer. In a preferred embodiment a low work function metal is used in the first layer, a doped conjugated polymer such as PEDOT-PSS in the second layer, while the cathode may be formed of the same metal as used in the first layer. Use in the manufacturing of the electrode arrangement in an organic thin-film diode or in a transistor structure.

18 Claims, 8 Drawing Sheets

U.S. PATENT DOCUMENTS

| | | | | | |
|---|---|---|---|---|---|
| 5,932,965 | A | * | 8/1999 | Berggren et al. | 313/506 |
| 5,965,281 | A | * | 10/1999 | Cao | 428/690 |
| 5,965,901 | A | * | 10/1999 | Heeks et al. | 257/40 |
| 6,014,119 | A | * | 1/2000 | Staring et al. | 345/82 |
| 6,117,965 | A | * | 9/2000 | Hwang et al. | 528/35 |
| 6,441,395 | B1 | * | 8/2002 | Yu et al. | 257/40 |

OTHER PUBLICATIONS

Kim, J.S. et al., J. of Applied Physics, vol. 84, No. 12 (1998) pp. 6859–6870 (Abstract only).

Granström, G. et al., Nature, vol. 395 (1998) pp. 257–260.

Bozano et al., Applied Physics Letters, vol. 74, No. 8 (1999) pp. 1132–1134.

Cao et al., Synthetic Metals, vol. 85 (1997) pp. 1267–1268.

Horowitz, G., Annales de Physique, vol. 11 (1986) pp. 31–35. (English Abstract).

Kaneto, K., JP J of Applied Physics, vol. 24, No. 7 (1985) pp. L553–L555.

Kamat, P.V. et al., Chem. Physics Ltrs., vol. 103, No. 6 (1984) pp. 503–506.

Li, C. et al., J. of Polymer Science Part B, vol. 33 (1995) pp. 2199–2203.

Xu, Z. et al., J. Electroanal. Chem., vol. 246 (1988) pp. 467–472.

*Metal Table*, Mcgraw–Hills/S.O. KASAP: Principles of Electrical Engineering Materials and Devices, Side 1.

* cited by examiner

METHOD IN THE FABRICATION OF ORGANIC THIN-FILM SEMICONDUCTING DEVICES

This application is the national phase under 35 U.S.C. § 371 of PCT International Application No. PCT/NO00/00127 which has an International filing date of Apr. 14, 2000, which designated the United States of America.

The present invention concerns a method for the fabrication of an organic thin-film semiconducting device, wherein the semiconducting device, comprises an electrode arrangement with electrodes contacting the semiconducting organic material.

The invention also concerns applications of the method according to the invention.

Particularly the invention concerns the modification of the injection properties of electrodes in an electrode arrangement for a semiconductor component manufactured with organic semiconducting material.

A paper by M. Granström et al., "Laminated fabrication of polymeric photovoltaic diodes", Nature, Vol. 395, pp. 257–260, discloses a photovoltaic diode with a double layer of semiconducting polymers. Photoexcited electron transfer between donor and acceptor molecular semiconductors provides a method of efficient charge generation after photoabsorption and can be exploited in photovoltaic diodes. But efficient charge separation and transport to the collector electrodes are problematic, because the absorbed photons must be close to the donor-acceptor heterojunction, while at the same time good connectivity of the donor and acceptor materials in the respective electrodes is required. Mixtures of acceptor and donor semiconducting polymers can provide phase-separated structures, which to some extent meet this requirement, and provide high photoconductive efficiencies. To this endGranström et al. disclose two-layer polymer diodes where the acceptor material is a fluorescent cyano derivative of poly(p-phenylene vinylene) (MEH-CN-PPV) doped with a small amount of a derivative of polythiophene (POPT). The acceptor layer is contacted by an electrode and covered by a glass substrate. The acceptor layer is laminated together with a donor layer of POPT doped with a small amount of MEH-CN-PPV which is spin-coated on either indium tin oxide (ITO) substrates or glass coated with polyethylene dioxide thiophene (doped with polystyrene sulphonic acid) (PEDOT-PSS). To ensure a low contact resistance, a thin layer of gold was thermally evaporated on the glass substrate before the PEDOT material was spin-coated thereon. SinceGranström et al. describe a photovoltaic diode, it is evident that they are not concerned with obtaining a high rectification ratio,as is desirable with switching diodes, nor is a difference in the work function values of the cathode and the anode an issue, although the materials envisaged for the anode, (ITO, PEDOT and gold) all have a high work function value, ranging from 4.8 for ITO to well above 5 eV for PEDOT and gold, with the work function values of the latter two being almost the same.

However, it has been found that particularly noble metals such as gold and platinum result in a poor quality of a conducting polymer thin film deposited and very often the polymer film has pin holes which are not acceptable when the films are arranged in a sandwiched geometry. Moreover gold is a costly material, although Granström et al. selected gold because of its high work function value matching that of PEDOT-PSS.

In switching semiconductor devices with diode structures a high rectification ratio at of the latter is desirable. It is also desired that the contact surface between an electrode and a semiconducting polymer provides efficient charge injection, but this latter feature is not of concern for collector electrodes, that are the anodes, in a photovoltaic device based on organic semiconducting materials.

It is known that the contact surface between a conducting and a semiconducting polymer has superior properties with respect to injection of charge. For example a conducting polymer based on poly(3,4-ethylenedioxythiophene) (PEDOT) possesses a very high work function which makes it suitable as anode in semiconductor components based on organic semiconductors, but the high resistivity of PEDOT limits the performance of components because of a very high series resistance. This is particularly unfortunate when the electrodes are patterned with line widths of the order of 1 $\mu$m. However, it is believed that such components shall be crucial to realizing high density memory cells for use in memory modules based on polymers as the memory material, provided that it is possible to achieve the desired high data read-out speed. This shall, however depend on the availability of highly conducting electrodes for the memory cells which can be manufactured with microfabrication methods.

The object of the present invention is therefore to provide a method for the manufacturing of an electrode for use in organic semiconductor components, and such that the electrode combines superior charge injection properties with a high conductivity. Furthermore it is an object of the invention to provide a method which permits the manufacturing of an electrode of this kind with patterned line widths in the order of 1 $\mu$m. Finally it is also an object of the present invention to provide a method for manufacturing of electrodes which can be used in organic thin-film diodes, with high rectification ratio, or in electrode arrangements in organic thin-film transistors.

The above-mentioned objects and advantages are achieved by a method according to the invention which is characterized by depositing a first layer of a conducting or semiconducting material or combination of a conducting and a semiconducting material in the form of a patterned or non-patterned layer on an insulating substrate, such that at least a portion of the substrate is covered by the first layer, modifying the work function of the conducting and/or semiconducting material of the first layer by depositing a second layer of a conducting polymer with a work function higher than that of the material in the first layer such that the layer of the conducting polymer mainly covers the first layer or is conformal with the latter, whereby the combination of the first layer and the second layer constitutes the anode of the electrode arrangement and the work function of the anode becomes substantially equal to that of the conducting polymer, depositing a third layer of a semiconducting organic material on the top of the anode, and optionally and in case only a portion of the substrate is covered by the anode, also above at least some of the portion of the substrate not covered by the anode, and depositing a patterned or non-patterned fourth layer of a metal on the top of the third layer, whereby the fourth layer constitutes the cathode of the electrode arrangement.

It is according to the invention advantageous when the conducting material of the first layer is a metal and preferably the metal is selected among calcium, manganese, aluminium, nickel, copper or silver. It is also preferred that the semiconducting material of the first layer is selected among silicon, germanium or gallium arsenide.

In preferred embodiments of the method according to the invention the second layer can be deposited as a dispersion from a dispergent or as a dissolved material from solution or alternatively deposited in a melt-application process.

It is according to the method of the invention advantageous to select the conducting polymer in the second layer as a doped conjugated polymer and preferably select the conjugated polymer from among poly(3,4-dioxyethylene thiophene) (PEDOT), a copolymer which includes the monomer, 3,4-dioxyethylene thiophene, substituted poly(thiophenes), substituted poly(pyrroles), substituted poly(anilines) or copolymers thereof, whereas the dopant for the conjugated polymer preferably is poly(4-styrene sulphonate) (PSS).

In a preferred embodiment of the method according to the invention the doped conjugated polymer is poly(3,4-ethylenedioxythiophene) (PEDOT) doped with poly(4-styrene sulphonate) (PSS).

It is according to the invention advantageous to select the semiconducting organic material in the third layer from among conjugated polymers, or crystalline, polycrystalline, microcrystalline and amorphous organic compounds, and in case the conjugated polymer is selected, it is preferred that this is selected from among poly(2-methoxy, 5-(2'-ethylhexyloxy)-1,4-phenylene vinylene) (MEH-PPV) or poly(3-hexylthiophene) (P3HT).

Finally it is according to the invention advantageous to selecti the metal of the fourth layer from among metals which have a lower work function than that of the anode and to particularly select the metal of the fourth layer as the same as the metal selected for the first layer, but aluminium could in any case particularly be selected as the metal of the fourth layer.

The method according to the invention is used for manufacturing the electrode arrangement in an organic thin-film diode or for manufacturing electrode arrangements in a transistor structure, especially in an organic thin-film transistor a hybrid thin-film transistor.

The invention shall now be described in more detail with reference to the accompanying drawings as well as an appended example of polymer-based diodes with high rectification ratio manufactured according to the method described in the present invention.

BRIEF DESCRIPTION OF DRAWINGS

FIG. 1b an example of the structure of a conjugated polymer belonging to the class of polythiophenes. viz. P3HT, FIG. 1c an example of the structure of a conjugated polymer belonging to the class of polyphenylene vinylenes, viz. MEH-PPV, FIG. 2a a plan view of a first embodiment of a diode made according to the method of the present invention, FIG. 2b a plan view of another embodiment of a diode made according the method of the present invention, FIG. 2c a cross section through the diode in FIG. 2b, FIG. 3a the ohmic current/voltage characteristics of a PEDOT layer between copper electrodes according to prior art and manufactured according to two different processing protocols, FIG. 3b the current density/voltage characteristics of a diode made by the method according to the present invention, and of a diode made according to prior art, FIG. 3c the current density/voltage characteristics of a diode made by the method according to the present invention, and of a diode made according to prior art, FIG. 3d the current density/voltage characteristics of a diode made by the method of the present invention, and of a diode made according to prior art, FIG. 3e the current density/voltage characteristics of a diode made by the method according to the present invention, and of a diode made according to prior art, FIG. 3f the rectification ratio of a standard diode made by the method according to the present invention, FIG. 4 a semilog plot of the current density/voltage characteristics of a prior art diode and a diode according to the present invention, with insert showing the rectification ratio as a function of the voltage for the diode according to the present invention, FIG. 5 the forward current density of a 100 $\mu m^2$ diode according to the present invention scaled with the forward current density of the inventive diode in FIG. 4, with insert showing a semilog plot of the current/voltage characteristics of the 100 $\mu m^2$ diode, and FIG. 6 the forward current density of a 1 $\mu m^2$ diode according to the present invention scaled with the forward current density of the inventive diode in FIG. 2, with insert showing a linear plot of the current/voltage characteristics of the 1 $\mu m^2$ diode.

Figure 1A:
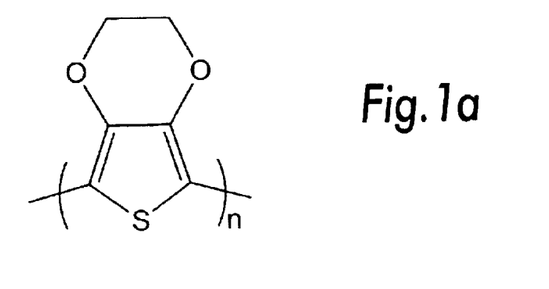
FIG. 1a shows in example of the structure of a conducting polymer, viz. PEDOT-PSS.
Figure 1B:
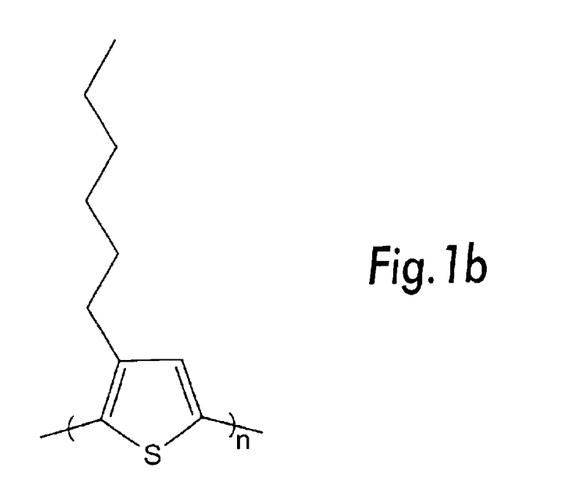
Figure 1C:
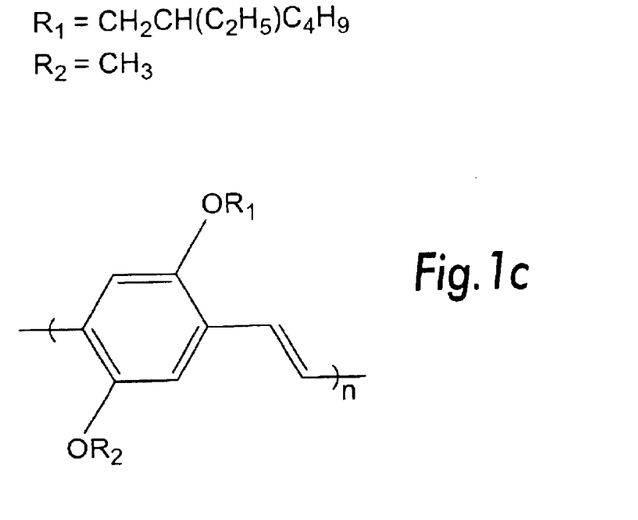

The present invention can be used to realize electrode arrangements for organic semiconductor components in thin-film electronics. In the anode a conducting polymer is used in the form of a conjugated polymer to which has been added a suitable dopant. FIG. 1 shows a structure of such a conducting polymer where the conjugated polymer is poly(3,4-ethylenedioxythiophene) (PEDOT) doped with poly(4-styrenesulphonate) (PSS). This type of conducting polymer shall be termed as PEDOT-PSS. FIG. 1b shows the structure of a semiconducting conjugated polymer belonging to the class of polythiophenes, namely poly(3-hexylthiophene) (P3HT) and FIG. 1c shows the structure of another semiconducting conjugated polymer, belonging to the class of polyphenylenevinylenes, namely poly(2-methoxy,5-(2'-ethylhexyloxy)-1,4-phenylenevinylene) (MEH-PPV). The use of these materials is well-known within organic semiconductor technology.

Figure 2A:
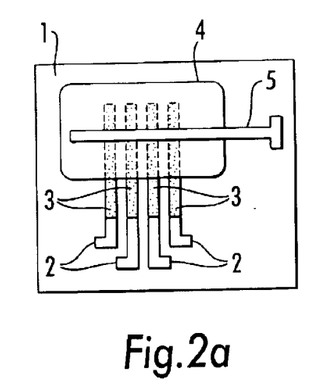

FIG. 2a shows a first embodiment of a diode in thin-film electronics made by the method according to the present invention. On a substrate 1 which is made from an electrically insulating material, e.g. glass or silicon where the surface is selectively oxidized to form silicon dioxide, there is patterned an electronic conductor with good conductivity, for example a metal in the form of thin stripes 2 which constitute a first layer 2 in the diode. The metal may be chosen among calcium, manganese, aluminum, nickel, copper or silver. Since the layer 2 constitutes a part of the anode in the diode, it might seem reasonable to select a metal with high work function value, for example Au or Pt as known in the prior art. However, these noble metals are more or less chemically inactive and at least as far as gold is concerned, also have a tendency to migrate into adjacent layers. Also gold should be avoided for reasons set out in the introduction. Therefore, according to the invention a metal with low work function shall be selected, for example copper, aluminum or silver which provide good adhesion to the overlying second layer 3 which is made with a conducting polymer with high work function values. According to a preferred embodiment of the invention the second layer 3 employs a conducting polymer in the form of PEDOT doped with PSS. In FIG. 2a this second layer 3 of PEDOT-PSS, is patterned conformally with the first layer 2, and the combination metal/PEDOT-PSS now constitutes the anode 2, 3 of the diode. Above the anode 2, 3 there is now provided a third layer 4 of a semiconducting polymer. According to a preferred embodiment of the invention the third layer is made of a semiconducting polymer, for instance preferably poly (2-methoxy,5-(2'-ethylhexyloxy)-1,4-phenylene vinylene) (MEH-PPV). Other semiconducting polymers may also be used, e.g. poly(3-hexylthiophene) (P3HT). Over the third layer 4 of semiconducting material the cathode 5 is now applied as a stripe electrode made from a metal with a suitably low work function value. This metal may e.g. be aluminum, but is not limited thereto and may in principle be made from other materials with comparable electronic properties, e.g. indium tin oxide (ITO). The diode in FIG. 2a now appears as a sandwich structure with the anode made from several patterned stripe electrodes and shall be representative for embodiments where the active area, i.e. the semiconductor layer 4 typically is of the size in the order of 1–100 $\mu m^2$.

Figure 2B:
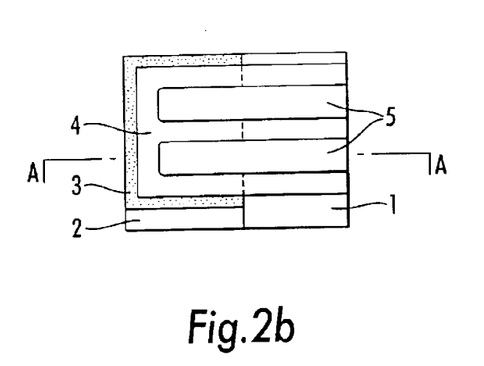
Figure 2C:
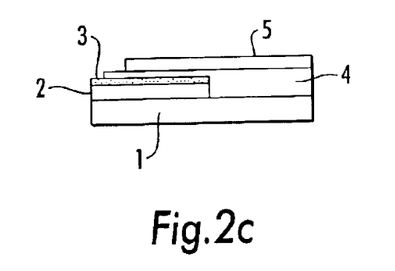

FIG. 2b shows a diode structure where the metal layer in the anode 2, 3 is deposited unpatterned, e.g. on one half of the substrate 1. The conducting semiconductor 3 which again preferably may be PEDOT-PSS, is deposited mainly over the whole metal layer 2 and the anode 2, 3 is now realized and is well suited for use in high power diodes. Again, the active material 4 in the form of a semiconducting material is deposited over the anode 2, 3, with the cathode 5 on top, made from e.g. aluminium, deposited as two parallel wide stripes and forming the fourth layer in the diode structure. FIG. 2c shows a cross-section through the diode of FIG. 2b cut along the line in the longitudinal direction through a cathode stripe 5. Typically the embodiment of the diode as shown in FIGS. 2b and 2c may represent a diode with an active area (i.e. the active semiconductor area 3) of the order of 6–10 $mm^2$.

In each case the embodiments of FIGS. 2a and 2b emerge as organic thin-film diodes in a sandwich construction.

Figure 3A:
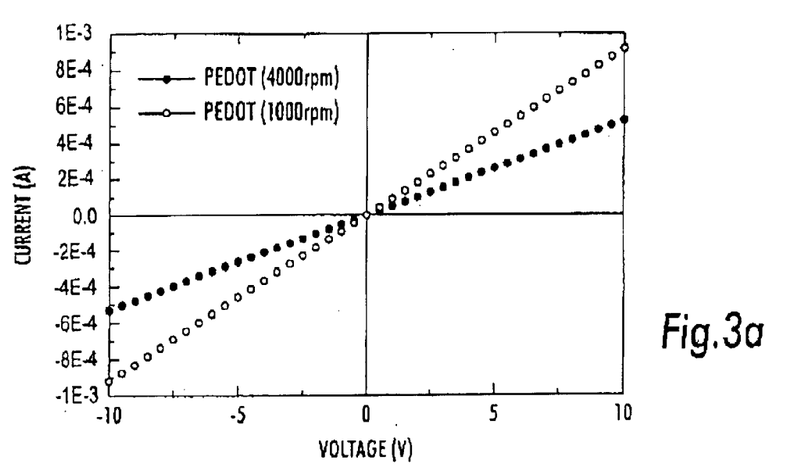

FIG. 3a shows ohmic current/voltage characteristics of a prior art device in planar geometry made with PEDOT between copper electrodes, in that the curve with filled circles shows the characteristics of PEDOT spin-coated at 4000 rpm and the curve with open circles the characteristics of PEDOT spin-coated at 1000 rpm. The distance between the copper electrodes is approximately 1 mm and the characteristic is linear, which is typical of an ohmic resistance.

Figure 3B:
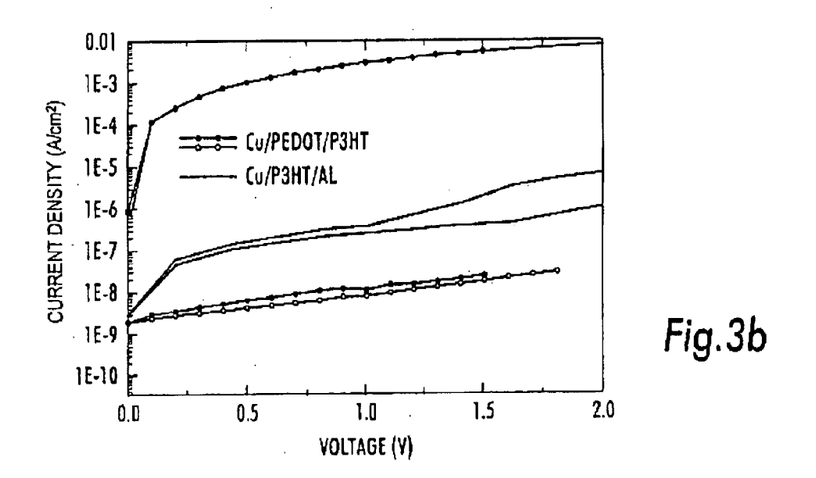

FIG. 3b shows the current density/voltage characteristic expressed respectively through the forward current in the conducting direction and backward current in the blocking direction of a diode according to prior art (solid lines) and of a diode made according to the method of the present invention (lines with circles/dots). The known diode is made with P3HT as the semiconducting material, spin-coated at 600 rpm from a 5 mg/ml solution and arranged between a copper anode and an aluminium cathode, respectively. The current in the forward direction is shown by the upper solid line and the current in the backward direction by the lower solid line. The diode made by the method according to the present invention has an anode 2, 3 made from a double layer of copper and PEDOT-PSS as the conducting polymer, spin-coated at 3000 rpm. The active semiconducting material P3HT is spin-coated at 600 rpm from a 5 mg/ml solution, and the cathode is made from aluminium. In this case the characteristic has been determined through two measurement series, and as can be seen from FIG. 3b the results are virtually identical. The respective measurement series are discerned through curves with open or closed circles, respectively. The two upper, almost coinciding curves exhibit the current in the forward direction, while the lower curves exhibit the current in the backward direction. The difference compared to the diode made by conventional means is obvious.

Figure 3C:
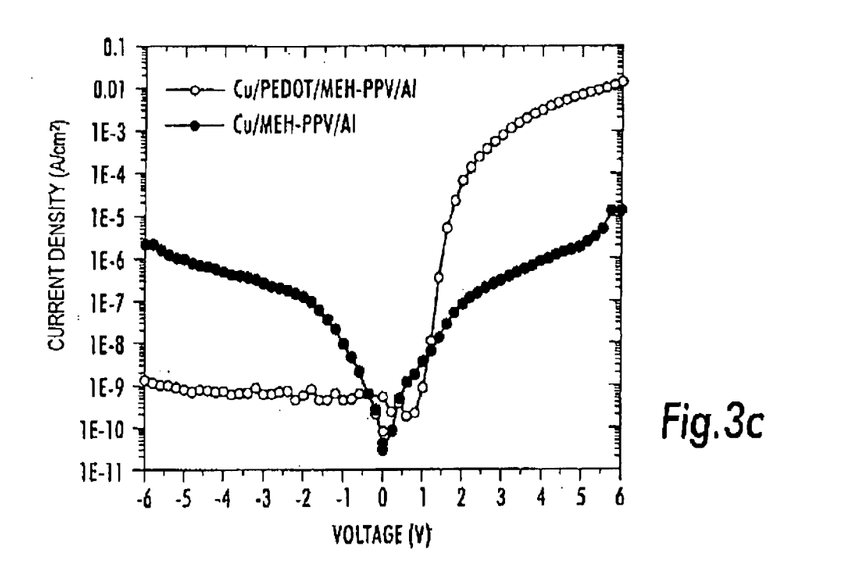

Correspondingly FIG. 3c shows the current density/ voltage characteristics of a diode according to prior art and a diode made according to the present invention. The diode according to known art employs MEH-PPV spin-coated at 800 rpm from a 5 mg/ml solution as the semiconductor material, arranged in sandwich between a copper anode and an aluminium cathode, respectively. Current/voltage characteristics are here represented by a curve with filled circles. The diode made by the method according to the present invention employs the same organic semiconductor material deposited under similar conditions, but again the anode is a double layer of copper with PEDOT-PSS spin-coated at 4000 rpm, and the cathode is made from aluminium. The characteristic in this case is shown as a curve with open circles and the difference between the characteristics of the known component and the component made by the method according to the present invention is again obvious.

Figure 3D:
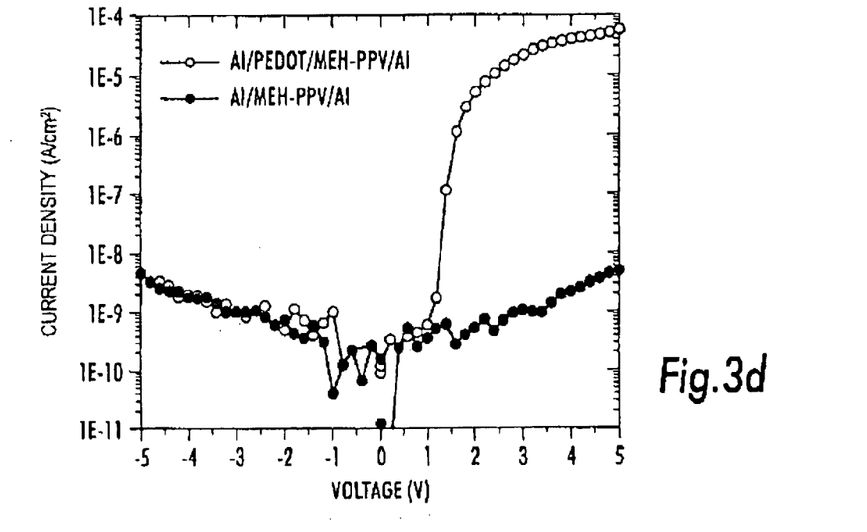

FIG. 3d shows in the same way as in FIG. 3c the current density/voltage characteristics of the same components, in that the conducting material and the active organic semiconducting material are deposited under exactly the same conditions respectively, but in both cases the anode is now made with aluminium.

Figure 3E:
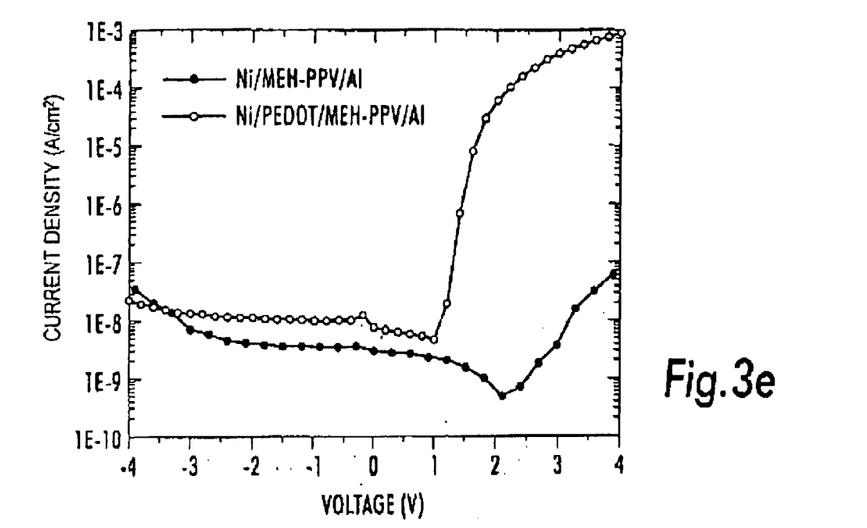

FIG. 3e shows the current density/voltage characteristics of a diode according to prior art and a diode made by the method according to the invention. The known diode employs active material consisting of MEH-PPV spin-coated at 600 rpm from a 5 mg/ml solution and arranged in sandwich between a nickel anode and an aluminium cathode. The characteristic is in this case shown by a curve with filled circles. The diode made by the method according to the present invention employs an anode made by a double layer of nickel and PEDOT-PSS spin-coated at 4000 rpm, while the active material is MEH-PPV spin-coated at 600 rpm from a 5 mg/ml solution, and the cathode is again aluminium. The characteristic is in this case shown by a curve with open circles.

Figure 3F:
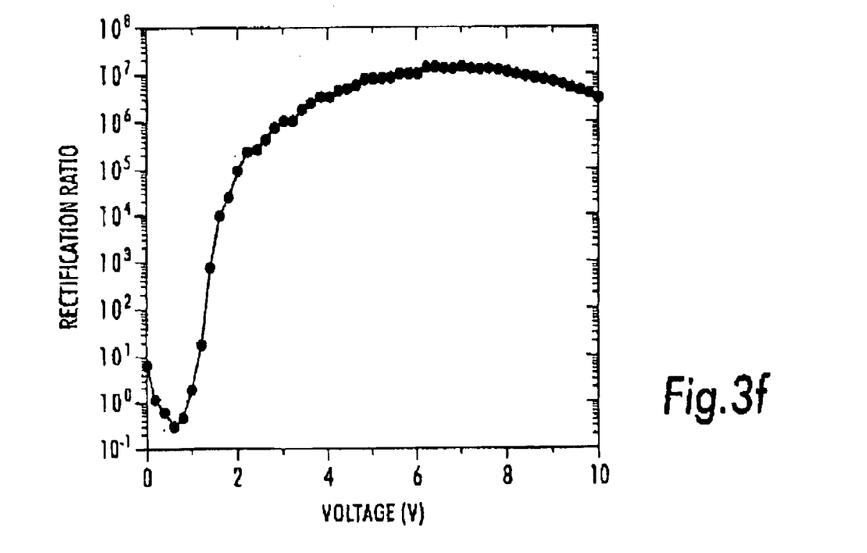

Finally, FIG. 3f shows the rectification ratio for a standard diode made by the method according to the present invention and with an anode in the form of a double layer of Cu/PEDOT-PSS, the active organic semiconductor in the form of MEH-PPV and with aluminium as the cathode. As can be seen at voltages of 3 volt and above a rectification ratio as high as $10^6$–$10^7$ is achieved.

According to the present invention anodes formed as double layers with metal, or alternatively a semiconductor or a semiconductor and a metal in combination, under a layer of a conducting polymer in the form of PEDOT-PSS improves the conductivity. The metal and the semiconductor in the anode may be Cu or Al which both possess a low work function, but in combination with PEDOT the anode appears with essentially the high work function of PEDOT. At the same time the combination of metal and PEDOT improves the conductivity of the anode. The PEDOT-PSS layer modifies the injection properties of the anode metal which has a low work function value, providing a problem-free hole injection. If the anode were made from metal only, the current flow would be limited by the contact, but the use of PEDOT-PSS ensures that the current flow now is be bulk-limited. By using a metal/PEDOT-PSS-anode it is, as shown in FIG. 3f, possible to make diodes with a rectification ratio of up to seven orders of magnitude. A major advantage which is achieved by employing an anode of metal and a conducting polymer, is the possibility of being able to pattern the anode. The use of metal under PEDOT yields higher conductivity along the electrodes compared to the conducting polymer itself. Even with patterned electrodes with line widths of the order of 1 μm, high current density can be achieved in combination with superior charge injection properties. This can be used to realize memory cells in polymer memories with high data storage density and it becomes possible to achieve high read-out speeds because of the highly conducting electrodes. At the same time the memory cells may be realized with line widths in the order of 1 μm by suitable patterning of the metal/polymer layer. In this connection it should be remarked that the contact between any metal in the anode and a highly doped conducting polymer shall be ohmic.

Below follows examples of diodes made by the method according to the present invention and the associated current/voltage characteristics that have been achieved, and associated figures.

EXAMPLE

A large effort has been undertaken towards fabrication of electronic devices using polymers. Most of these are directed towards field-effect transistors and diodes, in imitation of silicon electronics. Among the diodes, both light emitting diodes and light detecting diodes constitute the major fraction of the studies; in both of these a transparent electrode is suitable. However, a high rectification organic diode is quite important for a broad spectrum of electronic applications. In order to fabricate diodes based on semiconducting polymers with high rectification, one needs materials that allow efficient charge injection trough the polymer under forward bias, and much less so under reverse bias. Normally this is achieved using materials that match in energy position, or make low potential barriers, to the HOMO (Highest Occupied Molecular Orbital) and LUMO (Lowest Unoccupied Molecular Orbital) levels of the polymer. In the reverse bias both barriers for electrons and holes must be high enough to keep the current low, having thus as a result a high rectification ratio. But it is not just the energy levels that matter. The interface properties and the quality of the polymer film formed onto a given metal can define the diode properties; often polymer film spin-coated onto inert materials such as gold presents pin holes that are not acceptable if one needs to evaporate an upper electrode on top of the polymer film in a sandwich geometry. The conducting/semiconducting polymer interface tends to have good adhesion. The oxidized conducting polymer poly(3,4-ethylenedioxythiophene) doped with poly(4-styrene sulphonate) (PEDOT-PSS) was found to have the high work function value 5.2 eV which allows efficient hole injection in LEDs or collectors in photodiodes. However, the higher resistance of PEDOT-PSS compared with ordinary metals may compromise the diode performance in thin patterned lines, due to voltage drop under high currents. To handle this problem, a metal layer under the polymer is used. Any metal can be used as the underlying layer as it is not necessary to match the work function of the metal ($\phi_m$) with the work function of PEDOT ($\phi_{PEDOT}$). Since noble metals like gold and platinum which is commonly used in organic light-emitting diodes, are known to comport detrimental effects when used in conjunction with PEDOT, the preferred metals will be base metals with high conductivity.—The expression "base metals" as used herein, as opposed to noble metals, should be understood as metals with electrochemical potential less than 1 volt.—Diodes made with several metals (Al (4.2 eV), Ag (4.3 eV), Cu (4.5 eV)) were tested. In all cases the current flow of holes which was contact-limited, changed to bulk-limited when a PEDOT-PSS layer was used between the anode metal and the semiconducting polymer MEH-PPV (poly(2-methoxy, 5-(2'-ethyl-hexyloxy)-1,4-phenylene vinylene)). In order to study the electrical properties of diodes with different active areas copper was chosen as the underlying layer, particularly due to its good stability and etching properties. The Cu/PEDOT-PSS interface was demonstrated to be ohmic with a contact resistance $r_c \approx 7\ \Omega/\square$. The ohmic behaviour of Cu/PEDOT-PSS interface is an important asset for its use as an electrode in diodes. The contact resistance of Cu/PEDOT-PSS interface was measured using planar geometry to provide a copper surface similar to that used for the diodes.

The diodes were constructed in sandwich geometry using Cu/PEDOT-PSS as the anode and Al as the cathode ($\phi$=4.2 eV). They were mounted onto a glass or Si with 2 μm thick oxide substrate, as shown in FIGS. 2a–c. FIG. 2b shows the geometry for the ordinary diodes, usually with 6–10 mm² active area. For these diodes the copper layer was deposited by evaporation to a preferred thickness of 200 nm onto one half of the substrate. The PEDOT-PSS (Bayer AG. Germany) layer with a thickness of 80 nm, was deposited by spin-coating from a solution of water with 30% isopropanol, and filtered a using 1 μm pore glass filter. The PEDOT-PSS was patterned conformally onto the copper and then annealed for 5 min. in 120° C. It was noticed that the PEDOT-PSS solution reacts with copper oxide, etching the surface of the Cu film, which eases the formation of the contact. The semiconducting polymer layer was deposited by spin-coating using a MEHPPV polymer dissolved into chloroform at the concentration of 5 mg/ml, to a thickness of 190 nm. The second electrode Al was vacuum evaporated through a shadow mask defining the active area. For the diodes with 1 μm² and 10 μm² of active area the construction followed the patterning steps common in the Si technology. The processing includes patterning of Cu layer (200 nm thick) with PEDOT-PSS (80 nm thick) on top in 500 μm long stripes with width of 1 μm and 10 μm, followed by the annealing treatment. This patterned substrate was covered with MEH-PPV by spin-coating and Al was sputtered on top and patterned in stripes similar to Cu in order to make intersections of 1 μm² and 100 μm². The geometry of a diode of this kind is presented in FIG. 1b.

Figure 4:
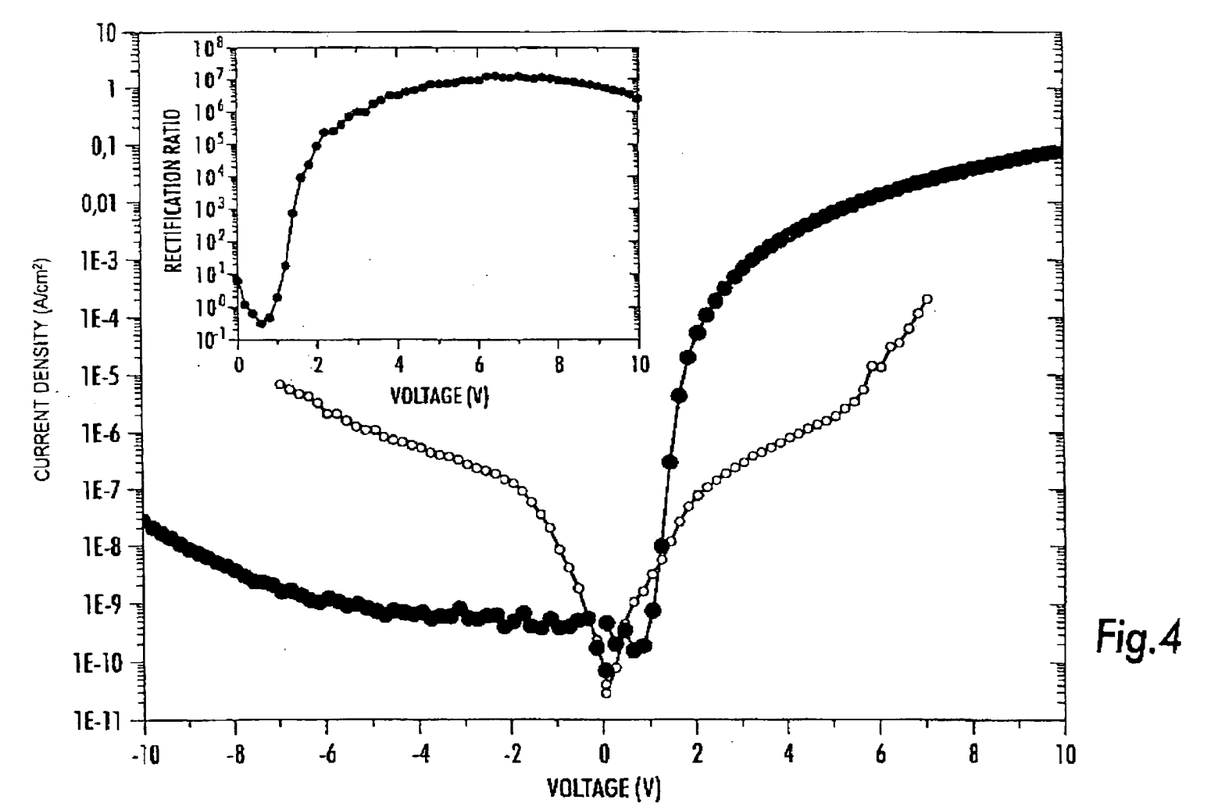

The I–V characteristics of two similar diodes made using MEH-PPV polymer is presented in FIG. 4, which shows a semilog plot of the current density/voltage characteristics of a MEH-PPV-based diode using a copper anode (open circles) and a similar MEH-PPV-based diode using a Cu/PEDOT-PSS anode (solid circles). The insert graph here shows a semilog plot of the rectification ratio versus the voltage for the diode with the Cu/PEDOT-PSS anode. The measurements were performed using a Hewlett Packard 4156A precision semiconductor parameter analyser in dark environment. It is possible to notice the difference in the shape of the current-voltage dependence due to the inclusion of the PEDOT-PSS layer. Due to higher value of the work function of PEDOT-PSS (5.2 eV) compared to Cu (4.5 eV), the energy barrier for hole injection from PEDOT-PSS to the MEH-PPV is $\phi \cong 0.1$ eV. This is much smaller than that from Cu to MEH-PPV which is $\phi \cong 0.8$ eV, as the current limitation in this two situations are different. Copper presents a contact-limited current regime; in this low injection regime the current densities are small and space charge effects can be neglected. With the inclusion of a thin layer of PEDOT-PSS it will be possible to make a transition to a bulk-limited current regime where the forward current is mostly due to the positive carriers coming from the Cu/PEDOT-PSS electrode. The Cu/PEDOT-PSS/MEH-PPV/Al diodes presented a J(V) function with three limiting regions, J being the current density. From 0 to 1 volt the current is at the noise level of the equipment; little charge flow occurs. This condition is due to the difference in the work function values of the electrodes (PEDOT-PSS and Al≅1 eV) which creates an inherent potential in the polymer layer that opposes hole injection. One first has to apply this voltage in order to inject charge. Between 1 and 2 volts the current has an exponential behaviour, and increases by five orders of magnitude. This dramatic increase is a property of the interface PEDOT-PSS/MEH-PPV with its low energy barrier. Beyond 2 volts the current becomes dependent on the transport properties of the MEH-PPV layer. The insert graph in FIG. 4 shows the rectification ratio value of this diode as a function of voltage, the rectification ratio being taken by dividing the forward by the reverse current. At 3 volts it already shows a rectification ratio of six orders of magnitude, increasing to seven between 4 and 8 volts. Beyond 8 volts the injection of holes from Al to MEH-PPV increases the reverse current decreasing the rectification ratio value.

Figure 5:
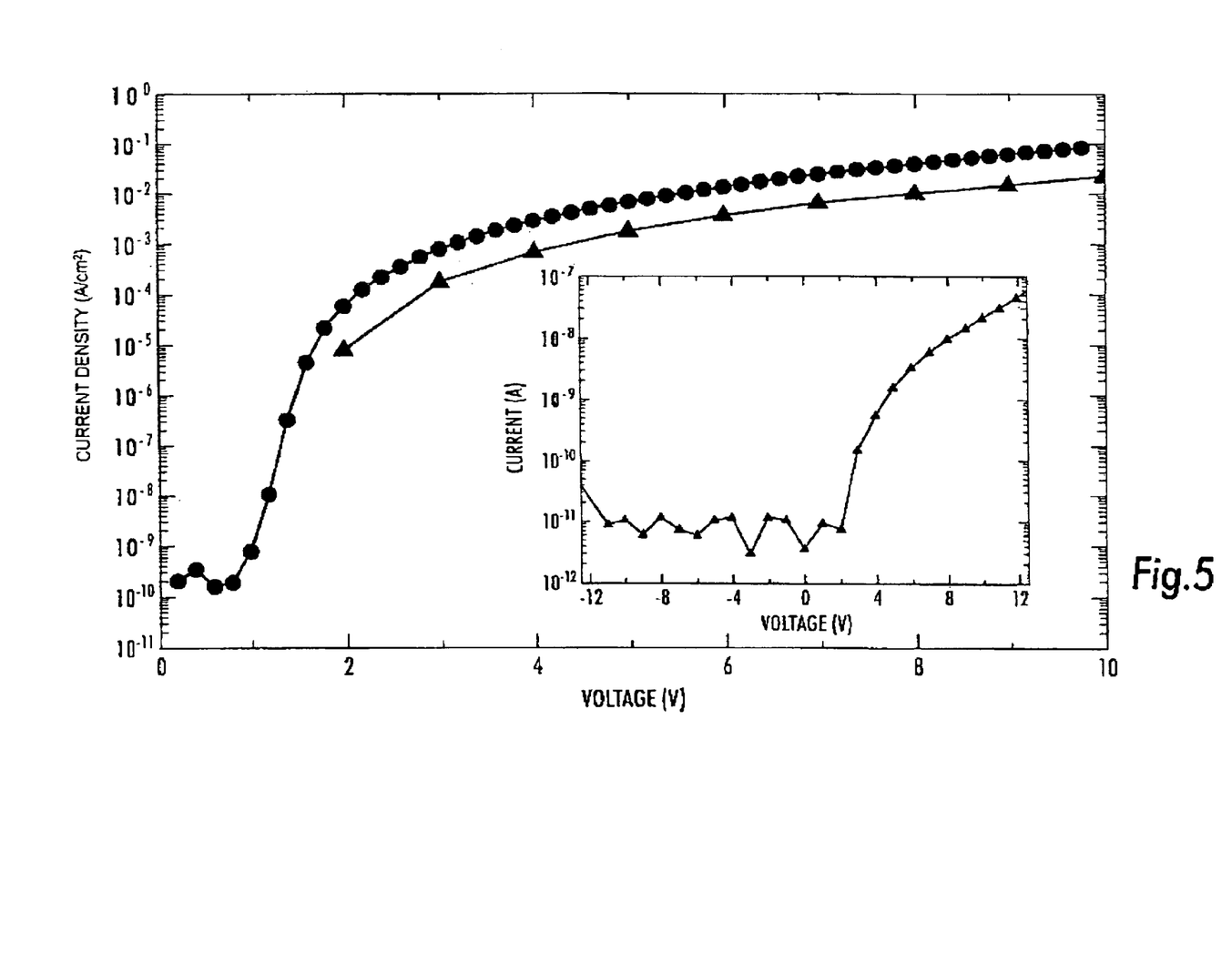

FIG. 5 shows the forward current density of a 100 $\mu m^2$ diode according to the invention and with Cu/PEDOT-PSS/MEH-PPV/Al structure (solid triangles) scaled with the forward current density (solid circles) of the diode according to the invention as shown in FIG. 4, while the insert graph shows a semilog plot of the current voltage characteristics of the 100 $\mu m^2$ diode.

The Cu/PEDOT-PSS/MEH-PPV/Al diodes with 100 $\mu m^2$ of active area presented a similar shape of the forward current-voltage characteristics, as can be seen in the insert graph in FIG. 5. In order to compare the I–V characteristics of both diodes, the current densities are plotted in FIG. 5 both for the diode of FIG. 4 (8 mm$^2$) and for the diode with 100 $\mu m^2$. The shift in the absolute value of the current can be correlated due to the thickness difference between the diodes. The scaling is quite consistent.

Figure 6:
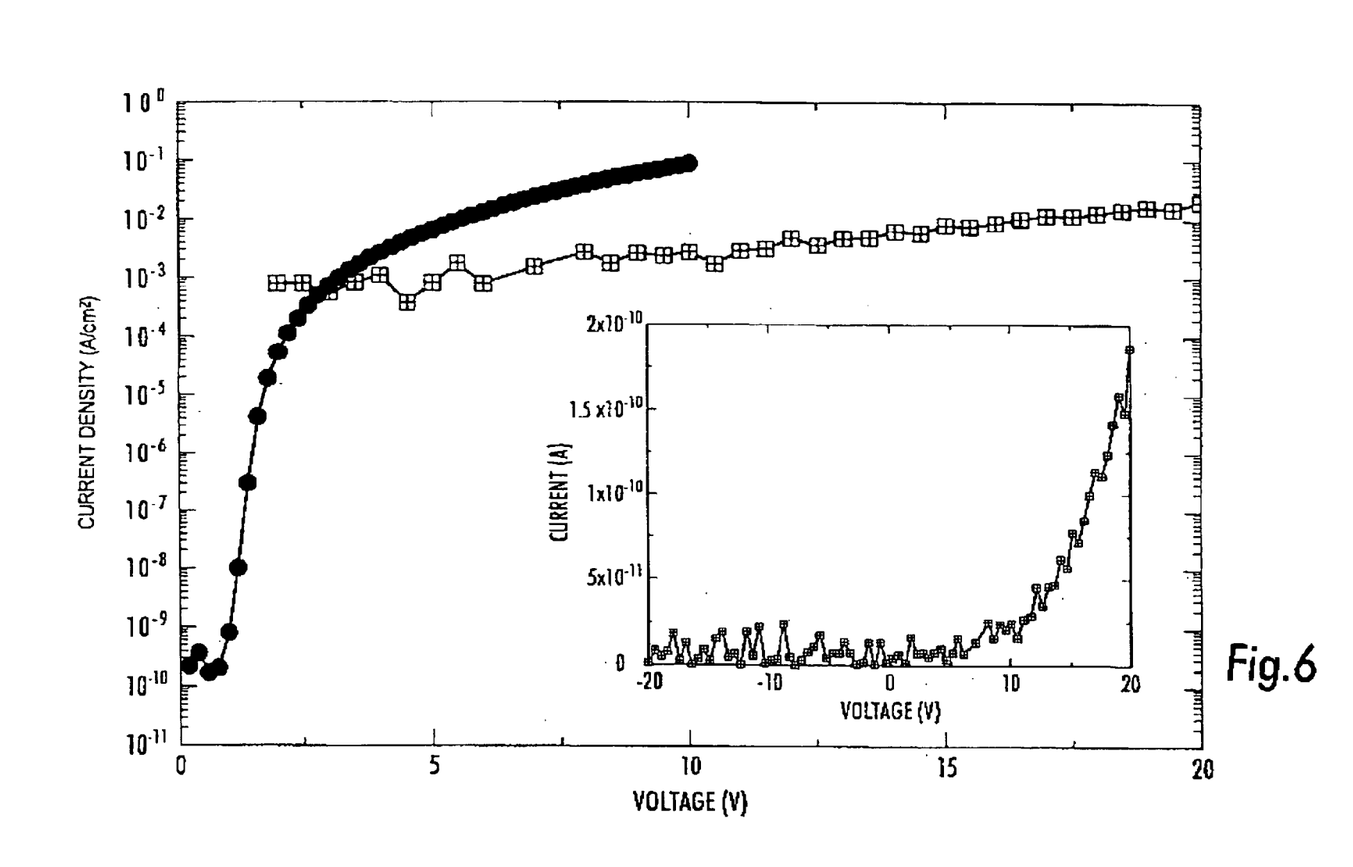

FIG. 6 shows the forward current density of a 1 $\mu m^2$ diode according to the present invention and with a Cu/PEDOT-PSS/MEH-PPV/Al structure (open squares) scaled with a forward current density of the diode (solid circles) according to the invention in FIG. 4, while the insert graph shows a linear plot of the current voltage characteristics of the 1 $\mu m^2$ diode.

However, for a diode of this size the current level is quite low, around the noise level as can be seen in the insert graph in FIG. 5. The I–V characteristics for the current densities of both the diode with 1 gm$^2$ active area and the one of 8 mm$^2$ active area are plotted. The function J(V) for the smaller diode is plotted up to twenty volts. It can be seen that the behaviour and shape do not scale very well with the larger diode. With these small diodes, the area extension is only ten times the thickness of the layers, and fringe fields are expected to start becoming important; even more important may be the existing irregularities causing any geometrical estimates to err.

The electrical transport properties of conjugated polymers and polymer/metals junctions have been studied for quite some time. The first attempt in modelling the PPV based diodes was based on the Fowler-Nordheim model describing the tunnelling process in the diode. It was possible to obtain the approximate values for barrier heights and for the polymer energy levels. A number of models have since then been presented, taking in account more parameters for detailing the interface properties. It is proposed that when the current is contact-limited the effect of Coulomb trapping of carriers at the interface can be determined by the image force. This trapping results in an increase of the energy barrier height, decreasing the injection flow. It was concluded that the presence of an insulating material free of traps could increase the charge injection. In the case of PEDOT-PSS it was shown that during the deposition of this material by spin-coating, a segregation of PEDOT and PSS takes place. PSS is an insulating material and it was found to form a thin layer all over the PEDOT surface film. This thin layer cannot trap charges from the electrode which may account for the improvement in the carrier injection from PEDOT. The bulk-limited current of MEH-PPV has been studied and reported by several research groups. It was found that at high fields MEH-PPV presents a spatial charge limitation of the current, and also that mobility is dependent on the applied electric field. In the present case the behaviour is similar, as the current does not depend on $V^2$ precisely because of the field-dependent mobility. This was proposed in a recent study by Malliaras et al., PRB, Vol 58, R13411 (1998). The use of a model developed by P. N. Murgatroyd (J.Phys. D. Vol. 3, 151 (1970)) combines spatial charge limitation dependence with the non-constant mobility in the same equation. From these models one can evaluate the data obtained herein by plotting the high field current in the function format JL$^3$ versus (VL), where J is the current density, L the polymer thickness and V the applied voltage minus the built-in voltage of the diodes. For the present invention this enabled a data fit and gave similar values for the polymer parameters $\mu_0$ and $E_0$. i.e. the zero field mobility and the characteristic field respectively.

In summary, the present invention provides a high rectification ratio polymer diode using two low work function metals, where the anode was modified by the introduction of a conducting polymer layer, PEDOT doped with PSS. With this surface modification it was possible to progress from a low injection contact-limited current to a high injection bulk-limited current. The PEDOT/PSS segregation might add to the charge injection by avoiding Coulomb trapping at the interface due to the force image effects. The possibility of making these diodes patterned on micrometer scale has been shown. This offers the prospect of fabricating such diodes for microelectronics with active devices such as switching diodes and switching transistors, but also in electrically addressable high-density thin-film memories in e.g. a passive matrix.

What is claimed is:

1. A method in the fabrication of an electrode structure for an organic thin-film semiconducting device, wherein the semiconducting device is a rectifying diode with a high rectification ratio of an organic thin-film transistor or a hybrid organic/inorganic thin-film transistor comprises forming a first layer of a base metal, a semiconducting material or as a combination of a base metal and a semiconducting material on a substrate, depositing a second layer of a conducting polymer on the first layer, said conducting polymer being selected among conducting polymers with a work function greater than the work function of the first layer, such that the real work function of the electrode structure in any case becomes equal to the work function of the selected conducting polymer, and providing the electrode structure in the semiconducting device such that the second layer contacts at least a portion of an active organic semiconductor material in said semiconducting device, modifying the work function of the conducting and/or semiconducting material of the first layer by depositing a second layer of a conducting polymer with a work function higher than that of the material in the first layer such that the layer of the conducting polymer mainly covers the first layer or is conformal with the latter, whereby the combination of the first layer and second layer constitutes the anode of the electrode arrangement and the work function of the anode becomes substantially equal to that of the conducting polymer, depositing a third layer of semiconducting organic material on top of the anode and if only a portion of the substrate is covered by the anode, optionally also depositing the third layer on top of at least some of the portion of the substrate not covered by the anode, and depositing a patterned or non-patterned fourth layer of a metal on the tope of the third layer, whereby the fourth layer constitutes the cathode of the electrode arrangement.

2. A method according to claim 1, wherein depositing the second layer is performed by depositing the second layer as a dispersion from a dispergent or as a dissolved material from a solution.

3. A method according to claim 1, wherein depositing the second layer is performed by depositing the second layer in a melt application process.

4. A method according to claim 1, wherein the step of depositing the second layer selects the conducting polymer in the second layer as a doped conjugated polymer.

5. A method according to claim 4, wherein the conjugated polymer among poly(3,4-dioxyethylene thiophene) (PEDOT), a copolymer which includes the monomer 3,4-dioxyethylene thiophene; substituted poly(thiophenes), substituted poly(pyrroles), substituted poly(anilines) or copolymers thereof.

6. A method according to claim 4, wherein the step of depositing the second layer selects the dopant for the conjugated polymer as poly(4-styrene sulphonate) (PSS).

7. A method according to claims 4, wherein the step of depositing the second layer selects as the doped conjugated polymer poly(3,4-ethylenedioxythiophene) (PEDOT) doped with poly(4-styrene sulphonate) (PSS).

8. A method according to claim 1, wherein the step of depositing the third layer selects the semiconducting organic material in the third layer among conjugated polymers, or crystalline, polycrystalline, microcrystalline and amorphous organic compounds.

9. A method according to claim 8, wherein the step of depositing the third layer selects the conjugated polymer in the third layer among poly(2-methoxy, 5-(2'-ethylhexyloxy)-1,4-phenylene vinylene) (MEH-PPV) or poly(3-hexylthiophene) (P3HT).

10. A method according to claim 1, wherein the step of depositing the first layer selects the inorganic semiconducting material of the first layer among silicon, germanium or gallium arsenide.

11. A method for the fabrication of an organic thin-film rectifier diode with high rectification ratio, wherein the rectifier diode comprises a first layer and a second layer provided on the first layer, such that the first and the second layers together form the anode of the rectifier diode, a third layer of a semiconducting organic material provided over the anode, such that the third layer forms the active semiconductor material of the diode, and a fourth layer of metal provided patterned or unpatterned over the third layer, such that the fourth layer forms the cathode of the rectifier diode, and wherein the method comprises:

depositing the first layer in the form of a base metal or an inorganic semiconductor or a combination of a base metal and an inorganic semiconductor on an insulating substrate, said first layer being deposited patterned or unpatterned such that at least a portion of the substrate is covered thereby, and depositing the second layer in the form of a conducting polymer over the first layer such that the second layer wholly or partly covers the first layer, said conducting polymer being selected as a conducting polymer with the work function equal to or greater than the work function of the first layer, whereby the work function of the anode in any case becomes equal to the work function of the conducting polymer.

12. A method according to claim 11, wherein the step of depositing the fourth layer selects the metal of the fourth layer among metals which have a lower work function than that of the anode.

13. A method according to claim 12, wherein the step of depositing the fourth layer selects the metal of the fourth layer as the same as the metal selected for the first layer.

14. A method according to claim 13, wherein the step of depositing the fourth layer selects aluminum as the metal of the fourth layer.

15. A method according to claim 14, characterized by selecting aluminum as the metal of the fourth layer.

16. Use of the method according to claim 14 for manufacturing the electrode arrangement in a transistor structure, especially in an organic thin-film transistor or a hybrid thin film transistor.

17. A method according to claim 11, wherein said step of depositing the first layer selects the metal of the first layer among calcium, manganese, aluminum, nickel, copper or silver.

18. A method according to claim 17, wherein only a portion of the substrate is covered by the anode, further comprising, depositing the third layer over at least a part of the portion of the substrate which is not covered by the anode.

* * * * *